US008803185B2

(12) United States Patent
Ling et al.

(10) Patent No.: US 8,803,185 B2
(45) Date of Patent: Aug. 12, 2014

(54) LIGHT EMITTING DIODE PACKAGE AND METHOD OF FABRICATING THE SAME

(75) Inventors: Peiching Ling, San Jose, CA (US); Vivek B. Dutta, Cupertino, CA (US)

(73) Assignee: Peiching Ling, San Jose, CA (US)

( * ) Notice: Subject to any disclaimer, the term of this patent is extended or adjusted under 35 U.S.C. 154(b) by 0 days.

(21) Appl. No.: 13/401,347

(22) Filed: Feb. 21, 2012

(65) Prior Publication Data
US 2013/0214315 A1   Aug. 22, 2013

(51) Int. Cl.
*H01L 33/00* (2010.01)

(52) U.S. Cl.
USPC ............. 257/99; 438/111; 438/117; 438/121; 438/123; 438/125; 257/668; 257/670; 257/671; 257/672; 257/692

(58) Field of Classification Search
USPC ........... 257/99, 100, 668, 670, 671, 672, 673, 257/692, 79, 80, 81, 618, 621, 622, 666, 257/676, 678, 684, 690, 696, 707, 719, 735, 257/784; 438/25, 111, 117, 121, 123, 125
See application file for complete search history.

(56) References Cited

U.S. PATENT DOCUMENTS

| 5,073,817 | A | * | 12/1991 | Ueda | 257/712 |
| 5,182,631 | A | * | 1/1993 | Tomimuro et al. | 257/664 |
| 5,202,288 | A | | 4/1993 | Doering et al. | |
| 5,291,062 | A | * | 3/1994 | Higgins, III | 257/698 |
| 5,583,370 | A | * | 12/1996 | Higgins et al. | 257/667 |
| 5,614,443 | A | * | 3/1997 | Nakashima et al. | 156/253 |
| 5,661,086 | A | * | 8/1997 | Nakashima et al. | 257/668 |
| 5,731,631 | A | * | 3/1998 | Yama et al. | 257/702 |
| 5,780,321 | A | | 7/1998 | Shieh et al. | |
| 5,811,876 | A | * | 9/1998 | Haga et al. | 257/675 |
| 5,986,334 | A | * | 11/1999 | Lee | 257/667 |
| 6,074,898 | A | * | 6/2000 | Ohsawa et al. | 438/123 |
| 6,130,477 | A | * | 10/2000 | Chen et al. | 257/712 |
| 6,166,430 | A | * | 12/2000 | Yamaguchi | 257/666 |
| 6,249,041 | B1 | * | 6/2001 | Kasem et al. | 257/666 |
| 6,372,526 | B1 | * | 4/2002 | Bailey et al. | 438/15 |
| 6,531,328 | B1 | | 3/2003 | Chen | |
| 6,569,764 | B1 | * | 5/2003 | Hirashima et al. | 438/673 |
| 6,724,580 | B2 | * | 4/2004 | Irie et al. | 360/294.4 |
| 7,183,132 | B2 | * | 2/2007 | Nakamura | 438/106 |
| 7,408,203 | B2 | * | 8/2008 | Kim et al. | 257/98 |
| 7,466,015 | B2 | | 12/2008 | Wu | |

(Continued)

OTHER PUBLICATIONS

International Search Report and Written Opinion dated Apr. 11, 2013 for International Application No. PCT/US2013/022690, 15 pages.

*Primary Examiner* — Zandra Smith
*Assistant Examiner* — Sophia Nguyen
(74) *Attorney, Agent, or Firm* — Amin, Turocy & Watson, LLP (57) ABSTRACT

A light emitting diode package and a method of fabricating the same. The package includes a light emitting diode chip having a first surface and a second surface opposing the first surface, a metal frame (or TAB tape) having leads connected to the light emitting diode chip, and a light-pervious encapsulant encapsulating the light emitting diode chip, wherein the second surface of the chip is exposed from the first light-pervious encapsulant. The metal frame (or TAB tape) connects the light emitting diode chip to an external circuit board. The LED package does not need wire-bonding process. A method of fabricating a light emitting diode package is also provided.

13 Claims, 10 Drawing Sheets

(56) References Cited

U.S. PATENT DOCUMENTS

| | | | |
|---|---|---|---|
| 7,742,142 B2* | 6/2010 | Chen | 349/150 |
| 2001/0054751 A1* | 12/2001 | Toyosawa | 257/668 |
| 2002/0182773 A1* | 12/2002 | Su et al. | 438/111 |
| 2004/0173810 A1* | 9/2004 | Lin et al. | 257/100 |
| 2006/0050526 A1 | 3/2006 | Ikeda et al. | |
| 2007/0252162 A1* | 11/2007 | Hirayama et al. | 257/94 |
| 2009/0243058 A1* | 10/2009 | Shirasaka | 257/670 |
| 2010/0012971 A1* | 1/2010 | Hiraoka et al. | 257/103 |
| 2010/0148200 A1* | 6/2010 | Lai et al. | 257/98 |
| 2010/0187546 A1* | 7/2010 | Fushimi et al. | 257/88 |
| 2010/0237367 A1* | 9/2010 | Lee et al. | 257/98 |
| 2010/0244210 A1* | 9/2010 | Fukushima et al. | 257/670 |
| 2010/0327420 A1* | 12/2010 | Xiao et al. | 257/686 |
| 2011/0050074 A1 | 3/2011 | Kim | |
| 2011/0081736 A1 | 4/2011 | Chuang et al. | |
| 2011/0175213 A1* | 7/2011 | Mori et al. | 257/675 |
| 2011/0241041 A1* | 10/2011 | Greenwood | 257/94 |
| 2011/0278637 A1* | 11/2011 | Kim et al. | 257/99 |
| 2012/0217614 A1* | 8/2012 | Burgyan et al. | 257/531 |

* cited by examiner

LIGHT EMITTING DIODE PACKAGE AND METHOD OF FABRICATING THE SAME

BACKGROUND OF THE INVENTION

1. Field of the Invention

This invention relates to Light Emitting Diodes (LED), and, more particularly, to an LED assembly and a method of fabricating the same.

2. Description of Related Art

With the progress of electronic industry and the advent of digital age, electronic products are designed to have a variety of functionalities. In recent years, eco-friendly electronic products such as light emitting diodes (LED) come to the market.

Figure 1A:
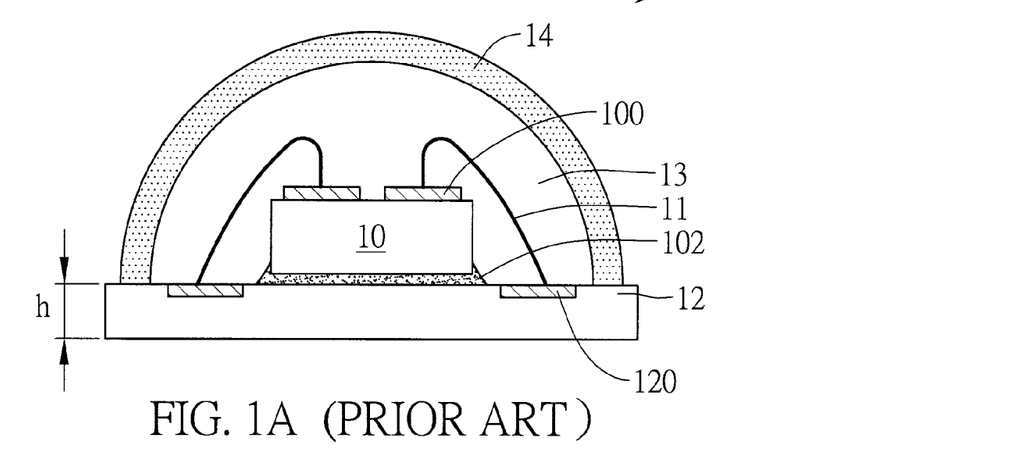
FIGS. 1A, 1A' and 1B are cross-sectional views of three different LED packages according to the prior art.

The LED chip is available in two configurations: (a) with both its +ve & −ve contact terminals (bond pads) on the same surface, shown as 10 in FIG. 1A; (b) with its +ve & −ye contact terminals (bond pads) on the opposite surfaces, shown as 10' in FIG. 1B. As the LED technology is advancing, several packaging and architectures are now available accommodating both these configurations. FIGS. 1A, 1A' and 1B show three different interconnect approaches in typical LED packages 1, 1" and 1' according to the prior art.

As shown in FIG. 1A, in the fabrication of the LED package 1 an LED chip 10 is disposed through an adhesive 102 on a substrate 12 having an inner circuit (not shown) and conductive pads 120; a wire bonding process is performed to electrically connect the electrode pads 100 of the LED chip 10 to the conductive pads 120 with gold wires 11; a light-pervious encapsulant 13 is formed on the substrate 12 for encapsulating the wire-bonded structure and a phosphor layer 14 is further formed over the light-pervious encapsulant 13, in more than one form or combination with the option to dispose the LED package 1 on and electrically connected to a circuit board (not shown).

As shown in FIG. 1A', in the fabrication of the LED package 1" the wire bonding process is eliminated and is replaced by 'flip-chip interconnect'. In this case metal electrodes (also known as 'bumps') are implanted on the electrode pads 100 of the LED chip 10 and are used to electrically connect the LED chip 10 on a substrate 12 having an inner circuit (not shown) to the conductive pads 120.

Figure 1B:
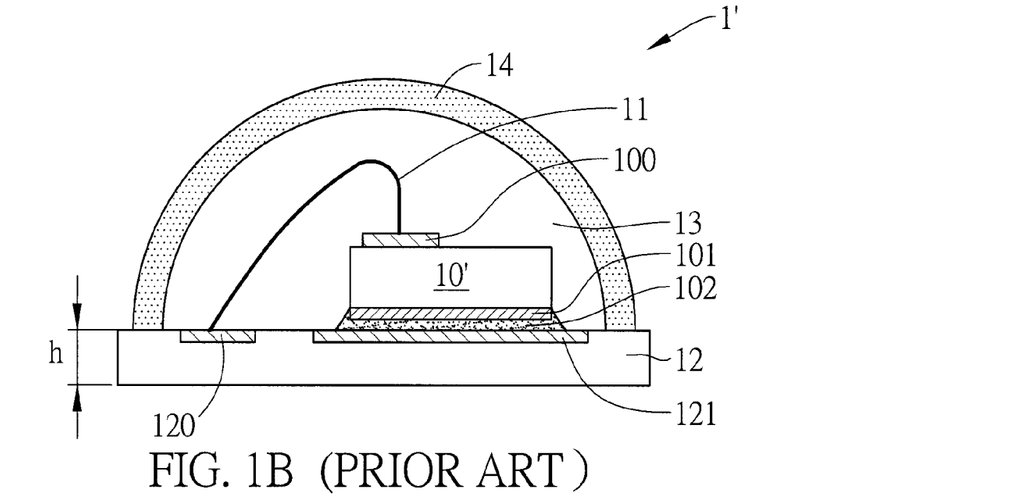

In the fabrication of the LED package 1' shown in FIG. 1B, an LED chip 10' is disposed through an electrically conductive adhesive 102 on a substrate 12 that has an inner circuit (not shown) and conductive pads 120 and 121 An electrode pad 101 formed on a bottom side of the LED chip 10' is electrically connected to the conductive pad 121; and a wire bonding process is performed to electrically connect an electrode pad 100 on a top side of the LED chip 10' to the conductive pad 120 with a gold wire 11. A light-pervious encapsulant 13 is formed on the substrate 12 for encapsulating the wire-bonded structure and a phosphor layer 14 is formed over the light-pervious encapsulant 13 in more than one form or combination with the option to dispose the LED package 1 on and electrically connected to a circuit board (not shown).

In the LED packages 1 and 1', since the electrode pads 100 are electrically connected to the conductive pads 120 with the gold wires 11, the substrate 12 that has the conductive pads 120 and 121 is needed for the conduction of the LED chips 10 and 10'. Therefore, the LED packages 1 and 1' have an increased overall height due to the use of the substrate 12 having a thickness h and the arc-shaped gold wire 11. However, in the LED packages 1" the height constraint due to the use of gold wires is eliminated, but the substrate still prevails.

Moreover, the conductive pads 120 and 121 of the substrate 12 have to be formed in accordance with the LED chips 10 and 10' and the circuit board, and thus sizes and pitches thereof have to be adjusted from one product to another. As such, the LED packages 1 and 1 are costly to fabricate.

Because the adhesive 102 needs to be disposed between the LED chips 10 and 10' and the substrate 12 and the substrate 12 is generally made of ceramics or plastics, the LED chips 10 and 10' have poor heat-dissipating efficacy.

Therefore, how to overcome the problems of the prior art is becoming one of the critical issues in the art.

SUMMARY OF THE INVENTION

In view of the above-mentioned problems of the prior art, the present invention provides a method of fabricating an LED package, comprising: providing a light emitting diode (LED) chip having a first surface and a second surface opposing the first surface, and forming at least a first electrode pad on the first surface of the LED chip; and connecting at least a first lead of a metal frame to the at least a first electrode pad.

The method further comprises disposing the light emitting diode (LED) package on a carrier component, forming on the carrier component a first light-pervious encapsulant that encapsulates the light emitting diode chip; and removing the carrier component.

The present invention further provides a method of fabricating a metal frame.

According to the previously described method, the present invention further provides an LED package, comprising: an LED chip having a first surface and a second surface opposing the first surface; at least a first electrode pad formed on the first surface of the LED chip; and a metal frame having at least a first lead electrically connected to the at least a first electrode pad.

In an embodiment, the at least a first lead each has a first end and a second end opposing the first end, and has a bended structure, allowing a height difference to exist between the first end and the second end and the light emitting diode chip to be received therein. Alternatively, the first lead has a first end connected to the first electrode pad and a second end opposing the first end, and a support layer that is metal is formed on the second end.

In an LED package according to the present invention, a conductive metal frame or TAB tape is used as an electrical connection element, in place of a gold wire or added metal electrodes (bumps) used in the prior art. Therefore, the LED package does not need a substrate that is used to connect with the gold wire. Compared with an LED package according to the prior art, an LED package according to the present invention has a reduced thickness.

In the fabrication of an LED package according to the present invention, a conductive metal frame is disposed on a circuit board, and a substrate having a conductive pad is no longer needed. Therefore, an LED package according to the present invention costs less.

Since the chip is now attached directly on the metal frame, the junction temperature of chip is lower due to improved heat-dissipating efficacy.

BRIEF DESCRIPTION OF DRAWINGS

The invention can be more fully understood by reading the following detailed description of the preferred embodiments, with reference made to the accompanying drawings, wherein:

Besides the standard methods existing per prior art.

FIG. 6B-1 is another embodiment of FIG. 6A.

DETAILED DESCRIPTION OF THE INVENTION

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

First Embodiment

Figure 2A:
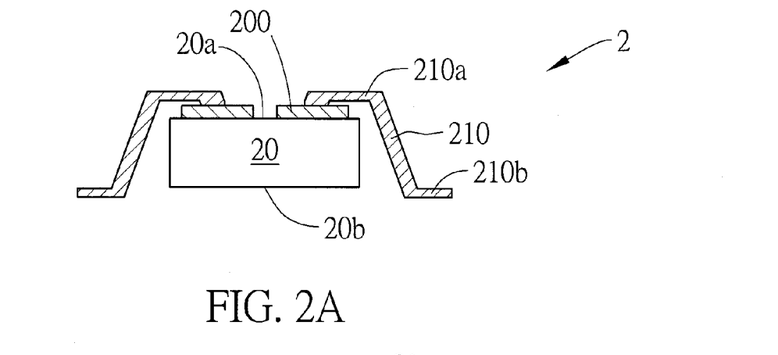
FIGS. 2A and 2B are cross-sectional views illustrating a method of fabricating an LED package of a first embodiment according to the present invention, wherein FIG. 2A' is a stereogram of FIG. 2A, and FIG. 2A" is another embodiment of FIG. 2A.
Figure 2B:
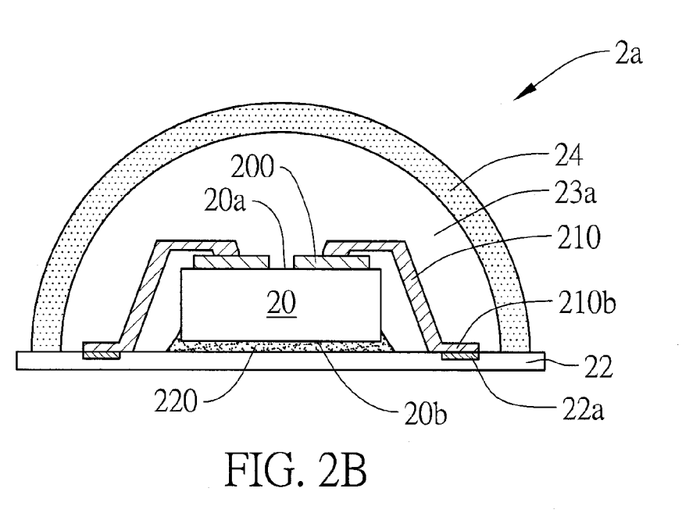

FIGS. 2A to 2C are cross-sectional views illustrating a method of fabricating a package of a first embodiment according to the present invention.

As shown in FIGS. 2A and 2A', a chip 20 and a metal frame 21 are provided. The chip 20 is a light emitting diode (LED) chip, and has a first surface 20a and a second surface 20b opposing the first surface 20a. A plurality of first electrode pads 200 are disposed on the first surface 20a of the chip 20. For instance, two first electrode pads 200 are disposed on the first surface 20a of the chip 20.

The metal frame 21 or TAB tape 21 has a plurality of first leads 210. The first leads 210 have first ends (hereinafter referred to as "inner ends 210a") and second ends (hereinafter referred to as "outer ends 210b") opposing the inner ends 210a. Each of the first leads 210 has a bended structure, and the first end and the second end have a height difference. The inner end 210a are connected to the first electrode pad 200, and the outer end 210b are used for connection of an external electronic device such as a circuit board. The plurality of first leads 210 form a dent structure for the chip 20 to be received therein. FIG. 2A' shows a modularized embodiment. The light emitting device structures 2 may be separated by cutting along a cutting line 2A-2A, for facilitating the serial or parallel design.

As shown in FIG. 2A", the plurality of first leads 210 may be coplanar, the first leads 210 may be disposed on connection pads 22a of a carrier component 22 having a circuit, and the chip 20 is disposed on the first leads 210. The chip 20 is thus installed on the carrier component 22 through the metal frame, such that the first leads 210 of the metal frame are disposed between the chip 20 and the carrier component 22, and a first light-pervious encapsulant 23a may be further formed to encapsulate the first leads 210 of the metal frame. Unlike the convention flip-chip structure shown in FIG. 1A', the thin enough LED chip 10 is easily cracked because a phosphor layer is adhered to the LED chip 10, if an underfill (not shown) is not formed between the LED chip 10 and the substrate 12. However, if the first leads 210 of the present invention are used as electrical connections, a high-density of phosphor layer may be formed on the chip 20 by an electrostatic charge process, without using the underfill. Therefore, a first light-pervious encapsulant is formed directly, and a package is thus obtained.

The electrostatic charge process is preferably performed in a reduced-pressure or a vacuum environment, so as to deposit a substantially uniform phosphor layer on a surface of the chip 20. The electrostatic charge process is detailed in U.S. Application No. 61/216,374 filed on May 15, 2009, U.S. Application No. 61/273,129 filed on Jul. 30, 2009, U.S. Application No. 61/284,792 filed on Dec. 26, 2009, U.S. application Ser. No. 12/587,290 filed on Oct. 5, 2009, U.S. application Ser. No. 12/587,281 filed on Oct. 5, 2009, U.S. application Ser. No. 12/587,291 filed on Oct. 5, 2009 and U.S. application Ser. No. 61/322,866 filed on Apr. 11, 2010, which are incorporated herein for references.

For example, the uniform phosphor layer may be formed by forming electrostatic charges on the chip 20 or grounding the chip 20, and moving the chip 20 to be close to and absorb the phosphor powder having opposite charges or particles formed by phosphor powder and a bonding material, so as to form the uniform phosphor layer. Of course, the phosphor powder may contain no charge, and the chip 20 has charges, in order to form the uniform phosphor layer. Unlike the conventional electro-chemical charge process in a slurry environment, the electrostatic charge process is performed in a non-liquid environment. In other words, the deposition process does not need to maintain and suffer from the uniform distribution of the phosphor powder and the boding agent in the liquid suspension. By contrast, in some embodiments the phosphor powder and the bonding material are formed on the surface of the chip 20, respectively. Therefore, the electrostatic charge process may accurately control the encapsulating density of the phosphor powder and the layer thickness. The previous mentioned "particles formed by the phosphor powder and bonding material" may be a mixture having phosphor powder and bonding material or another mixture having phosphor powder encapsulated by bonding material, and the phosphor powder occupies more than 75% of the volume of the phosphor layer.

When the uniform phosphor layer comprises phosphor powder constituted by a plurality of phosphor particles, the phosphor particles of the phosphor layer occupy more than 75% of the volume of the phosphor layer. A bonding layer (having a thickness less than 10 μm) is further formed on the uniform phosphor layer after the electrostatic charge process. The bonding layer may be silicone, epoxy resin, glass, softens or any suitable material applicable to an LED package, such as Parylene, which has excellent anti-moisture property and can prevent the phosphor hr LED from being degraded in a humid/hot environment.

Refer to FIG. 2B, which illustrates a method of electrically connecting first leads 210 and forming a first-light previous component 23a. The second surface 20b of the chip 20 is disposed on the carrier component 22 through an adhesive 220. Then, the first leads 210 shown in FIG. 2A are electrically connected to the first electrode pads 200 and the connection pads 220. Then, the first light-pervious encapsulant 23a is disposed on the carrier component 22 to encapsulate the chip 20 and the first lead 210, a uniform phosphor layer 24 is, optionally, formed on the first light-pervious encapsulant 23a to cover the first surface 20a of the chip 20, and the first light-pervious encapsulant 23a is disposed between the uniform phosphor layer 24 and the chip 20.

The uniform phosphor layer 24 comprises phosphor powder and a bonding material, and the phosphor powder occupies more than 75% of a volume of the uniform phosphor layer 24.

Of course, the phosphor layer may also be formed on a surface of the chip.

The phosphor is used to convert or change the wavelength of light emitted by an LED, for example. In general, the phosphor includes YAG, TAG, ZnSeS, and SiAlON such as α-SiAlON. However, any material may be used as the phosphor material, as long as it can convert the wavelength of incident light. The term "phosphor" used herein indicates all materials that convert or change a wavelength to another wavelength, and includes compound or composition of different wavelength-converting materials. The phosphor, since being in a powder form, is also called phosphor powder.

Alternatively, the phosphor powder is composed of a plurality of phosphor particles.

In the method of fabricating the semiconductor package 2, the metal frame 21 is used to replace the gold wire used in the prior art. As such, the semiconductor package 2 does not include a substrate that is used to electrically connect the gold wire, and has a reduced overall height.

Second Embodiment

Figure 3A:
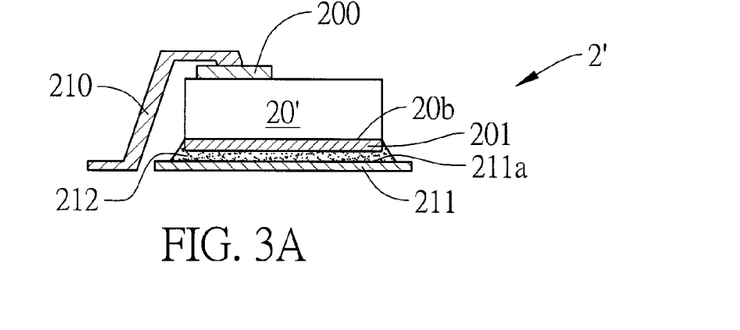
FIGS. 3A to 3B are cross-sectional views illustrating a method of fabricating an LED package of a first embodiment according to the present invention, wherein FIG. 3A' is a stereogram of FIG. 3A.
Figure 3B:
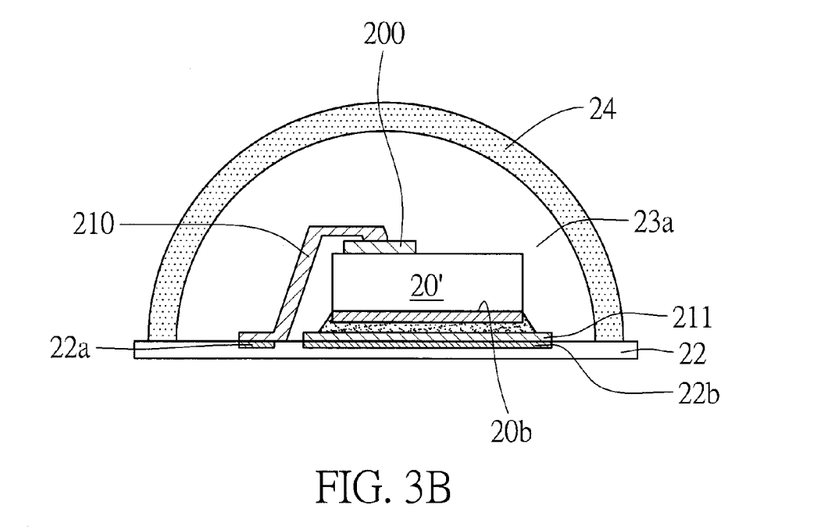

FIGS. 3A and 3B are cross-sectional views illustrating a method of fabricating a semiconductor package of a second embodiment according to the present invention. The second embodiment differs from the first embodiment in locations of the electrode pads of the chip and the structure of the metal frame.

As shown in FIGS. 3A and 3A', a plurality of second electrode pads 201 are further disposed on the second surface 20b of the chip 20', and a metal frame 21' further comprises a plurality of second leads 211 having top surfaces 211a connected to the second electrode pads 201. Optionally, the second leads 211 may be connected to the second electrode pads 201 through an adhesive 212.

As shown in FIG. 3B, the second leads 211 are connected to the connection pads 22b of the carrier component 22, then the chip 20' is disposed on the second leads 211 through the encapsulant 220, the first leads shown in FIG. 2A are electrically connected to the first electrode pads 200 and the connection pads 22a, and the first light-pervious encapsulant 23a and the uniform phosphor layer 24 are formed sequentially.

If an adhesive 212 is used in the semiconductor package 2', the metal frame 21' is made of a metal material, which can provide a good enough heat-dissipating path. Compared with the substrate of the prior art which is made of ceramics or plastics, the second surface 20b of the chip 20' has an improved heat-dissipating efficacy.

The light emitting device 2, 2' has: a chip 20, 20' having a first surface 20a and a second surface 20b opposing the first surface 20a, and a metal frame 21, 21' having first leads 210. Preferably, the light emitting device 2, 2' may further comprise a first light-pervious encapsulant 23a that encapsulates the chip 20, 20', and a uniform phosphor layer 24 formed on the first light-pervious encapsulant 23a.

The chip 20, 20' is a light emitting diode chip, and first electrode pads 200 are formed on the first surface 20a.

Each of the first leads 210 of the metal frame 21, 21' has an inner end 210a connected to one of the electrode pads 200 and an outer end 210b connected to an electronic device such as a circuit board (not shown).

The second surface 20b of the chip 20, 20' is exposed from the first light-pervious encapsulant 23a. In an embodiment, second electrode pads 201 are formed on the second surface 20b of the chip 20', and the metal frame 21' further has second leads 211 for electrical connection of the exposed second electrode pads 201.

The uniform phosphor layer 24 covers the chip 20, 20', and the first light-pervious encapsulant 23a is formed between the uniform phosphor layer 24 and the chip 20, 20'. In another embodiment, the uniform phosphor layer may be formed between the first light-pervious encapsulant 23a and the chip 20, 20', or formed on the second surface 20b of the chip 20 (not shown).

The uniform phosphor layer 24 comprises phosphor powder and bonding material, and the phosphor powder occupies more than 75% of the volume of the uniform phosphor layer 24. Alternatively, the uniform phosphor layer 24 may comprise phosphor powder composed of a plurality of phosphor particles, and the phosphor particles occupy more than 75% of the volume of the uniform phosphor layer.

Third Embodiment

Figure 4A:
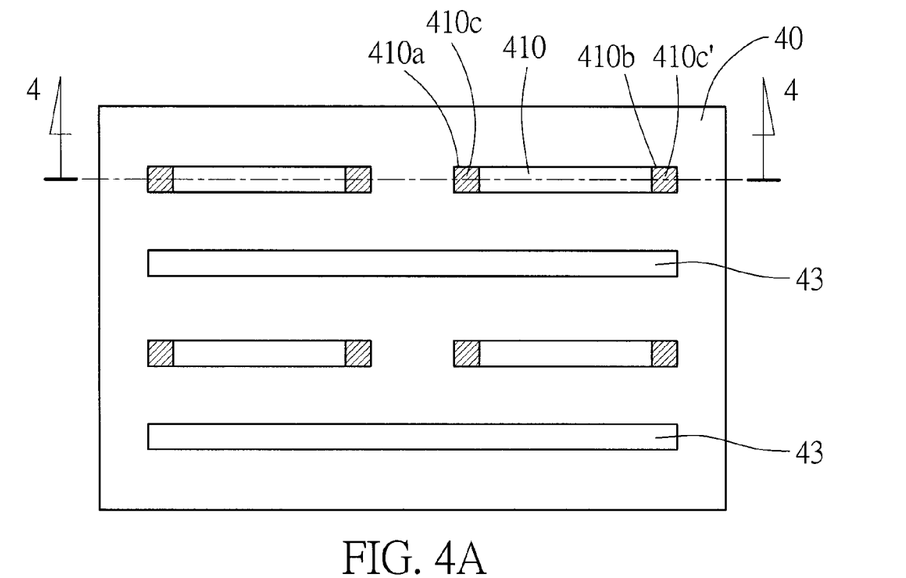
FIGS. 4A-4C illustrates a novel method of fabricating a metal frame according to the present invention, wherein FIG. 4A' is a cross-sectional view along a cutting line 4-4 of FIG. 4A, FIG. 4C' is another embodiment of FIG. 4C, and FIG. 4C" is a schematic diagram illustrating a chip disposed in a dent of the carrier component.
Figure 4B:
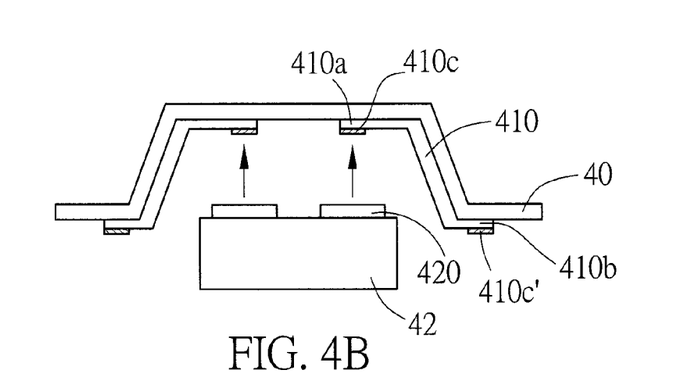
Figure 4C:
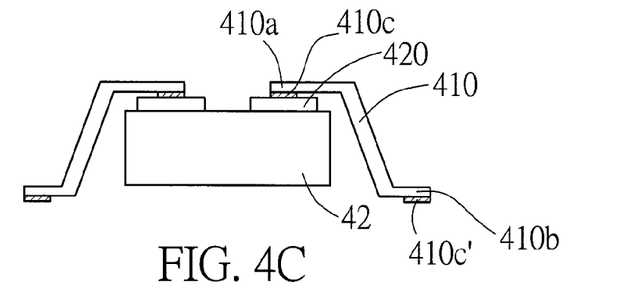

FIGS. 4A to 4C illustrate a method of fabricating a metal frame. FIG. 4A' is a cross-sectional view of the metal frame along a cutting line 4-4 of FIG. 4A. The metal frame is made by: forming on a substrate 40 a leaf of metal layer 410 having a first end 410a and a second end 410b opposing the first end 410a; and forming on the first end 410a and second end 411b of the metal layer 410 conductive elements 410c, 410c' made of conductive materials (for example: nickel, gold/tin or the combination thereof), such that the metal layer 410 and the conductive element 410c constitute a first lead 41. The metal layer 410 may be formed by screen printing or other conventional plating or etching techniques.

As shown in FIG. 4B, the substrate 40 is bended and reversed, such that the first end 410a and the second end 410b have a height difference, as shown in FIG. 4C, and the conductive element 410c of the first lead 41 is electrically connected to the first electrode pad 420 of the light emitting diode chip 42; and the substrate 40 is removed.

In an embodiment, the substrate is an organic substrate, such as polyimide or other cheaper and softer polymer such as polyethylene, as long as the bonding force of the substrate and the metal layer does not affect the separation thereof. When a softer substrate is used, a support layer 43 is formed on the substrate, as shown in FIG. 4A.

If the metal frame is formed as shown in FIG. 2A", the substrate is not bended, and may be removed after the first lead 41 is connected to the first electrode pad 420. Of course, a first light-pervious encapsulant 44 that encapsulates the metal frame may be formed on the substrate before the substrate is removed, as shown in FIG. 4C'.

Referring to FIG. 4C''', a conductive element 410c' made of nickel, gold/tin or the combination thereof is also formed on a second end 410b of a leaf of metal layer 410.

The present invention is not limited to the embodiment of FIG. 4C" in which the conductive component 410c' is formed on the metal layer 410. In the embodiment, the metal layer 410 is not bended. The chip 42 is disposed in a dent 450 of a carrier component, and the metal layer 410 that acts as a first lead comprises a first end 410a electrically connected to a first electrode pad 420 and a second end 410b opposing the first end 410a and electrically connected to the carrier component 45. Since the metal layer 410 is stiffer than a solder wire and has a certain flexibility, a broader dimension tolerance, e.g., a vertical drop between the chip 42 and the dent 450, may be provided.

Fourth Embodiment

Figure 5:
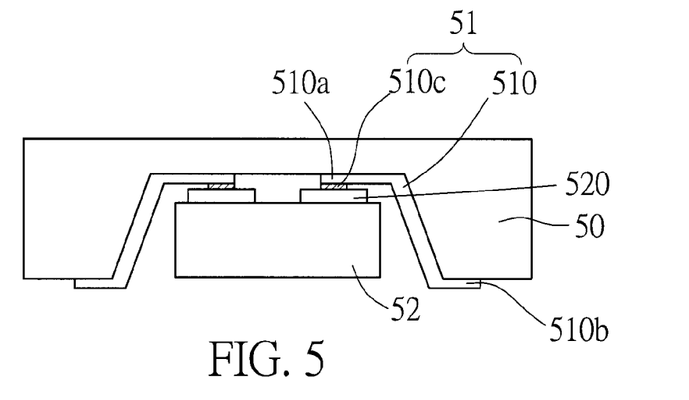
FIG. 5 is a cross-sectional view of a metal frame fabricated through the use of a mold.

Please refer to FIG. 5, which illustrates another method of fabricating the metal frame. The method comprises: forming on a mold 50 at least a leaf of metal layer 510 having a first end 510a and a second end 510b opposing the first end 510a, wherein the first end 510a and the second end 510b have a height difference due to the shape of the mold 50; forming a conductive element 510c on the first end 510a of the metal layer 510, such that the metal layer 510 and the conductive element 510c constitute the first lead 51; electrically connecting the conductive element 510c of the first lead 51 to the first electrode 520; and removing the mold 50.

Fifth Embodiment

Figure 6A:
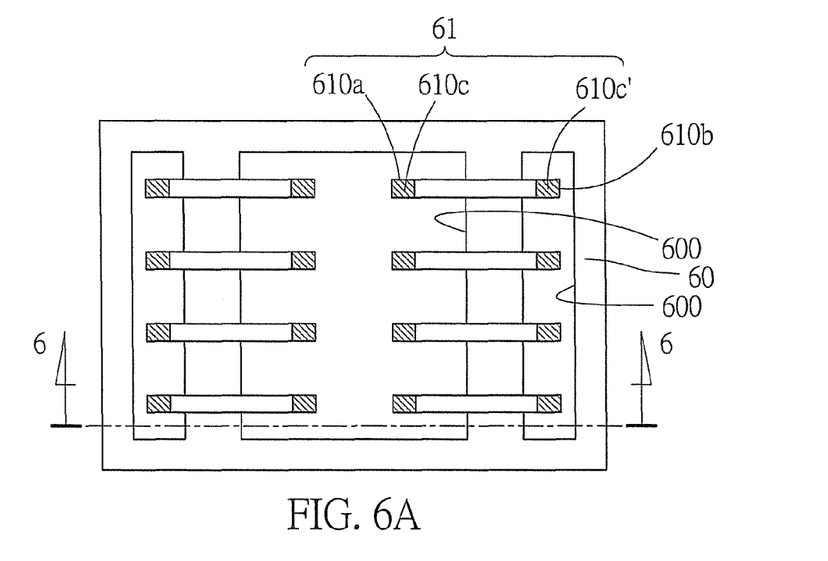
FIGS. 6A-6B illustrates a method of fabricating a light emitting diode package according to the present invention, wherein FIG. 6A' is a cross-sectional view along a cutting line 6-6 of FIG. 6A.
Figure 6B:
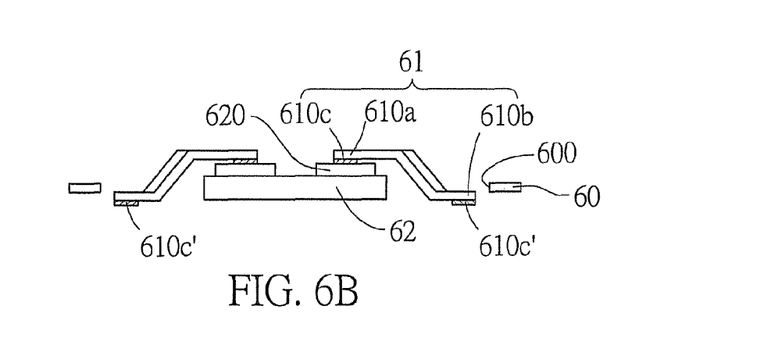

Referring to FIGS. 6A and 6B, another method of fabricating a light emitting diode package of an embodiment according to the present invention is illustrated. The metal frame is formed on a support layer 60 having a plurality of opening areas 600. The support layer 60 is made of metal or polymer such as polyimide. At least a portion of the first lead 61 is exposed from the opening area 600. The first lead 61 has a first end 610a and a second end 610b opposing the first end 610a. The exposed first end 610a is connectible to the first electrode pad of the light emitting diode chip, and the second end 610b is exposed from the opening area 600. Said opening areas 600 could prevent the support layer 60 from being contacted with a heater during reflow process. As shown in FIG. 6B, the support layer 60 and the first lead 61 are bended, and the first electrode pad 620 of the light emitting diode chip 62 is formed on the first end 610a. Besides, the first end 610a and second end 610b are respectively formed with conductive elements 610c, 610c'. After the installation of the light emitting diode chip 62, the support layer may be peeled off so as to obtain a plurality of light emitting devices.

Figure 6B:
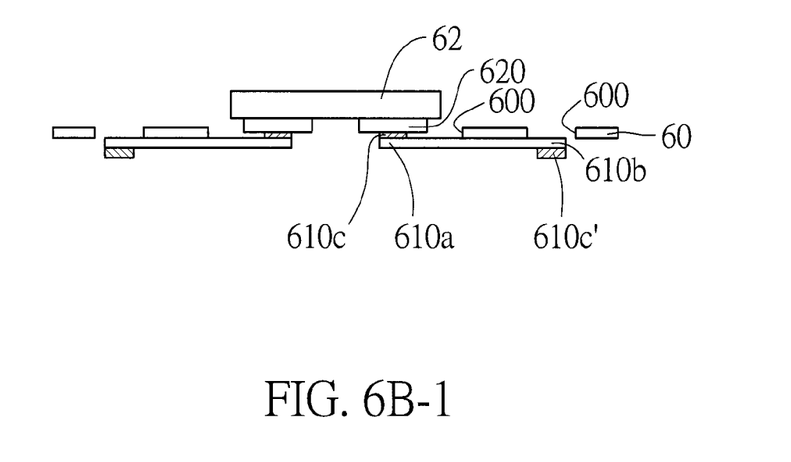

In another aspect, as shown in FIG. 6B-1, conductive elements 610c, 610c' are respectively formed on the top surface of the first end 610a and bottom surface of the second end 610b before the light emitting diode chip 62 is disposed on the first end 610a.

According to the light emitting device structure obtained from the fifth embodiment, the first lead 61 has a first end 610a connected to the first electrode pad 620 and a second end 610b opposing the first end 610a, and the conductive element 610c and support layer 60 are positioned on the same surface.

Sixth Embodiment

Figure 7A:
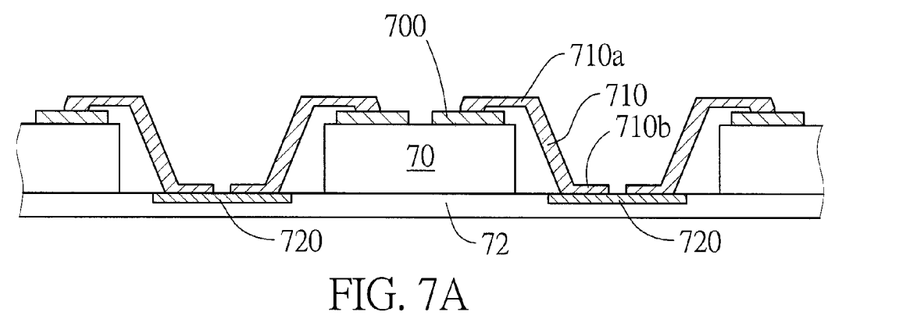
FIGS. 7A, 7B, and 7C are schematic diagrams illustrating a metal frame electrically connected to a chip.
Figure 7B:
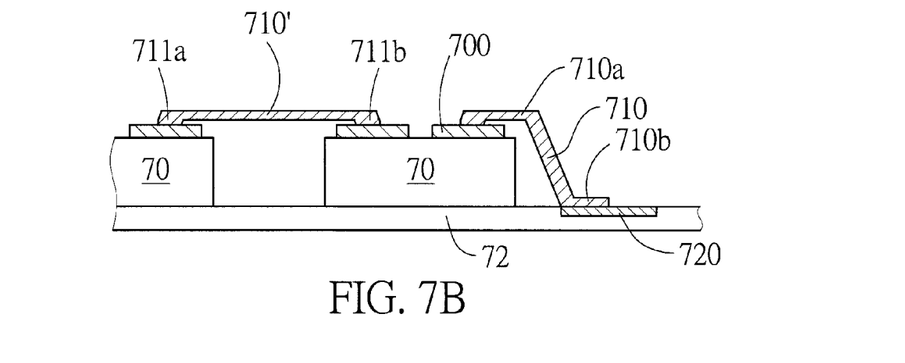
Figure 7C:
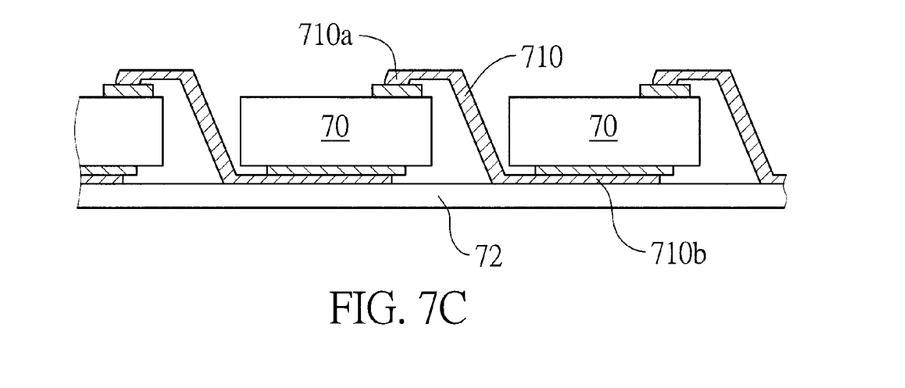

Referring to FIGS. 7A, 7B, and 7C, schematic diagrams illustrating a metal frame electrically connected to a chip in a serial manner according to the present invention are shown.

As shown in FIG. 7A, a plurality of chips 70 are disposed on a carrier component 72, each of the chips 70 has a plurality of first electrode pads 700, and connection pads 720 are formed on the carrier component 72 adjacent the chips 70.

The metal frame of the present invention has a plurality of first leads 710, each of which has a first end 710a electrically connected to one of the first electrode pads 700 and a second end 710b electrically connected to one of the connection pads 720 of the carrier component 72.

Alternatively, each of the formed first leads 710' has two ends 711a and 711b serially electrically connected to the chips 70, respectively. A serial structure of the plurality of chips 70 and carrier component 72 is achieved as long as the second end 710b of one of the first leads 710 on one of the chips 70 is connected to one of the connection pads 720 of the carrier component 72. A person skilled in the art is allowed to amend the above embodiments.

Referring to FIG. 7C, another example of serial structure is illustrated. Each of the first leads 710 has a first end 710a electrically connected to the top surface of the chip 70 and a second end 710b electrically connected to the bottom surface of the chip 70.

In a semiconductor package and a method of fabricating the same according to the present invention, a metal frame is used to carry a chip and to electrically connect a circuit board. Therefore, the semiconductor package does not need a substrate installed or conduct a wire bonding process. The semiconductor package thus has a reduced height.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A light emitting diode package, comprising:
   a light emitting diode chip having a first surface and a second surface opposing the first surface;
   at least a first electrode pad formed on the first surface of the light emitting diode chip;
   a metal frame having at least a first lead electrically connected to the at least a first electrode pad; and
   a support layer having a plurality of opening areas, and wherein the at least a first lead each has a first end connected to the at least a first electrode pad and a second end opposing the first end, and both of the first end and the second end are exposed from a corresponding one of the opening areas of the support layer and free from being in contact with the support layer.

2. The light emitting diode package of claim 1, wherein the at least a first lead is in a bending structure and has a first end and a second end opposing the first end, and the first end and the second end have a height difference for the light emitting diode chip to be received therein.

3. The light emitting diode package of claim 1, wherein the support layer is made of metal or polymer.

4. The light emitting diode package of claim 1, further comprising at least a second electrode pad formed on the second surface of the light emitting diode chip, wherein the metal frame further comprises at least a second lead connected to the at least a second electrode pad.

5. A method of fabricating a light emitting diode package, comprising:
   providing a light emitting diode chip having a first surface and a second surface opposing the first surface, and at least a first electrode pad formed on the first surface; and
   connecting at least a first lead of a metal frame to the at least a first electrode pad, wherein the metal frame is made by:

forming on a surface of a substrate at least a leaf of metal layer having a first end and a second end opposing the first end;

forming a conductive element on the first end of the metal layer, such that the metal layer and the conductive element are formed into the first lead; and removing the substrate after the first lead is connected to the at least a first electrode pad.

6. The method of claim 5, wherein the metal frame is further made by:

bending the substrate such that the first end and the second end have a height difference; and connecting the conductive element of the first lead to the at least a first electrode pad.

7. The method of claim 6, wherein a support component is formed on the substrate.

8. The method of claim 5, further comprising forming on the substrate a first light-pervious encapsulant that encapsulates the metal frame before the substrate is removed.

9. The method of claim 5, wherein the substrate is an organic substrate.

10. A method of fabricating a light emitting diode package, comprising:

providing a light emitting diode chip having a first surface and a second surface opposing the first surface, and at least a first electrode pad formed on the first surface; and connecting at least a first lead of a metal frame to the at least a first electrode pad, wherein the metal frame is made by:

forming on a mold at least a leaf of metal layer having a first end and a second end opposing the first end, the first end and the second end having a height difference;

forming a conductive element on the first end of the metal layer, such that the metal layer and the conductive element are formed into the first lead;

connecting the conductive element of the first lead to the at least a first electrode pad; and removing the mold.

11. A method of fabricating a light emitting diode package, comprising:

providing a light emitting diode chip having a first surface and a second surface opposing the first surface, and at least a first electrode pad formed on the first surface; and connecting at least a first lead of a metal frame to the at least a first electrode pad, wherein the metal frame is formed on a support layer having a plurality of opening areas, and the at least a first lead each has a first end connected to the at least a first electrode pad and a second end opposing the first end, and both of the first end and the second end are exposed from a corresponding one of the opening areas of the support layer and free from being in contact with the support layer.

12. The method of claim 11, wherein the first end and the second end have a height difference for the light emitting diode chip to be received therein.

13. The method of claim 11, wherein the support layer is made of metal or polymer.

* * * * *